US011216126B2

(12) United States Patent
Zhong et al.

(10) Patent No.: US 11,216,126 B2
(45) Date of Patent: Jan. 4, 2022

(54) TOUCH SCREEN AND MANUFACTURING METHOD THEREOF, DISPLAY SUBSTRATE, AND TOUCH DISPLAY DEVICE

(71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventors: Tengfei Zhong, Beijing (CN); Shifeng Xu, Beijing (CN); Xinxiu Zhang, Beijing (CN); Min He, Beijing (CN); Bin Pang, Beijing (CN); Xiaodong Xie, Beijing (CN); Lei Zhang, Beijing (CN); Yuan Li, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 71 days.

(21) Appl. No.: 16/454,340

(22) Filed: Jun. 27, 2019

(65) Prior Publication Data
US 2020/0033996 A1 Jan. 30, 2020

(30) Foreign Application Priority Data
Jul. 26, 2018 (CN) .......................... 201810835441.1

(51) Int. Cl.
*G06F 3/044* (2006.01)

(52) U.S. Cl.
CPC .. *G06F 3/0443* (2019.05); *G06F 2203/04103* (2013.01); *G06F 2203/04107* (2013.01); *G06F 2203/04112* (2013.01)

(58) Field of Classification Search
CPC .... G06F 3/0443; G06F 3/04164; G06F 3/044; G06F 2203/04112; G06F 2203/04107; G06F 2203/04103; H05K 1/0259
See application file for complete search history.

(56) References Cited

U.S. PATENT DOCUMENTS

| | | | |
|---|---|---|---|
| 2013/0093696 A1* | 4/2013 | Huang | G06F 3/0445 345/173 |
| 2014/0028582 A1* | 1/2014 | Choi | G06F 3/0412 345/173 |
| 2015/0077649 A1* | 3/2015 | Lee | G06F 3/044 349/12 |

* cited by examiner

*Primary Examiner* — Alexander Eisen
*Assistant Examiner* — Kebede T Teshome
(74) *Attorney, Agent, or Firm* — Brooks Kushman P.C.

(57) ABSTRACT

The present disclosure provides a touch screen and a manufacturing method thereof, a display substrate, and a touch display device. The touch screen includes: at least one metal mesh layer and electrostatic leading lines, wherein each metal mesh layer includes a plurality of electrodes insulated from each other, and the electrostatic leading lines extend among the plurality of electrodes of the at least one metal mesh layer and are connected to grounding wires, wherein the electrostatic leading lines are arranged to be insulated from the plurality of electrodes.

13 Claims, 3 Drawing Sheets

TOUCH SCREEN AND MANUFACTURING METHOD THEREOF, DISPLAY SUBSTRATE, AND TOUCH DISPLAY DEVICE

CROSS-REFERENCE TO RELATED APPLICATION

This application claims priority to Chinese Patent Application No. 201810835441.1 filed on Jul. 26, 2018, which is incorporated herein by reference in its entirety.

TECHNICAL FIELD

The present disclosure relates to the field of touch technology, and in particular to a touch screen and a manufacturing method thereof, a display substrate, and a touch display device.

BACKGROUND

In the current touch screen market, One Glass Metal Mesh (OGM) products have excellent performance in many aspects, such as fast signal transmission speed, high sensitivity, good linearity, etc., and have been widely used and gradually accepted by customers.

An OGM product includes a metal mesh layer for forming a touch electrode. In order to form a plurality of touch electrodes, the metal mesh layer located in the same layer need to be cut at certain positions. However, for example, in a black matrix region made of an insulating material located in the periphery of the touch screen, since the charges accumulated in the region are difficult to be conducted to the outside, it is easy to cause Electro-Static Discharge (ESD) after the electrostatic charges are collected to the tip of the metal mesh line at the cut. Electro-static discharge leads to electrostatic breakdown, resulting in poor appearance and malfunction.

SUMMARY

The present disclosure provides a touch screen including:
at least one metal mesh layer, wherein each metal mesh layer includes a plurality of electrodes insulated from each other, and
electrostatic leading lines which extend among the plurality of electrodes of at least one metal mesh layer and are connected to a grounding wire, wherein the electrostatic leading lines are arranged to be insulated from the plurality of electrodes.

Optionally, at least one metal mesh layer includes the grounding wire, and in the at least one metal mesh layer including the grounding wires, the electrostatic leading lines and the grounding wire are arranged in a same layer and electrically connected to each other.

Optionally, the at least one metal mesh layer includes a first metal mesh layer and a second metal mesh layer, the first metal mesh layer includes a plurality of first electrodes, the second metal mesh layer includes a plurality of second electrodes, the electrostatic leading lines extend among the plurality of first electrodes, and are connected to a grounding wire provided in the second metal mesh layer through via holes.

Optionally, the second metal mesh layer further includes second electrode wirings at the periphery of the plurality of second electrodes, the second electrode wirings are connected to the grounding wires provided in the second metal mesh layer, and the electrostatic leading lines are connected to the second electrode wirings through the via holes.

Optionally, the first metal mesh layer further includes first electrode wirings at the periphery of the plurality of first electrodes, an extending direction of the electrostatic leading lines is different from that of the first electrode wirings.

Optionally, the touch screen is divided into a touch region and a peripheral region located at the periphery of the touch region, the touch screen further includes a black matrix provided in the peripheral region, and the electrostatic leading lines extend into the region covered by the black matrix.

Optionally, the first electrodes and the second electrodes are arranged in a crossed manner, one of the first electrode and the second electrode is a driving electrode, and the other is a sensing electrode.

Optionally, an insulation layer is disposed between the first metal mesh layer and the second metal mesh layer.

The present disclosure further provides a manufacturing method of a touch screen including:
providing a base substrate, the base substrate including a touch region and a peripheral region provided at the periphery of the touch region;
forming a black matrix in the peripheral region;
forming patterns of at least one metal mesh layer and electrostatic leading lines, each metal mesh layer including a plurality of electrodes insulated from each other; the electrostatic leading lines extending among the plurality of electrodes of at least one metal mesh layer and being connected to a grounding wire, wherein the electrostatic leading lines are arranged to be insulated from the plurality of electrodes.

The present disclosure further provides a display substrate including the above touch screen.

Optionally, a base substrate of the touch screen is also used as a base substrate of the display substrate.

The present disclosure further provides a touch display device including the above touch screen.

BRIEF DESCRIPTION OF THE DRAWINGS

In order to illustrate the technical solutions of the embodiments of the present disclosure more clearly, the drawings to be used in the embodiments of the present disclosure will be briefly described below. It is obvious that the drawings in the following description are only some embodiments of the present disclosure, and those skilled in the art can also obtain other drawings based on these drawings without any creative labor.

DETAILED DESCRIPTION

In order to make the objects, the technical solutions and the advantages of the embodiments of the present disclosure more clearly, the technical solutions of the embodiments of the present disclosure will be clearly and completely described below in conjunction with the drawings of the embodiments of the present disclosure. It is obvious that the described embodiments are a part of the embodiments of the present disclosure, and not all of them. All other embodiments obtained by those skilled in the art based on the embodiments of the present disclosure belong to the protective scope of the present disclosure.

Figure 1:
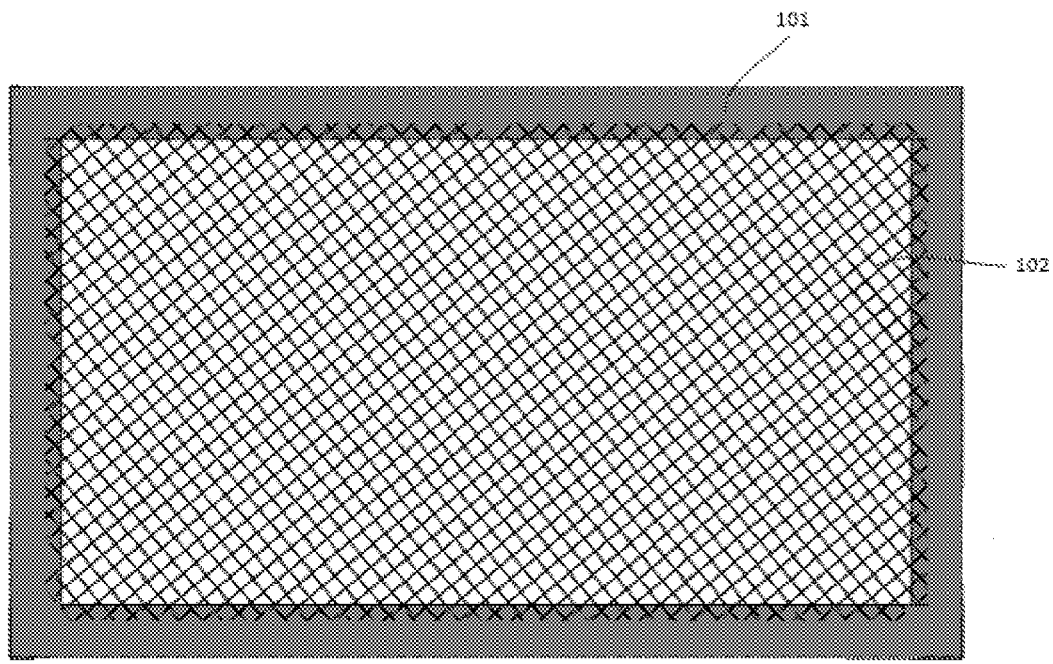
FIG. 1 is a schematic diagram of a structure of an OGM device in the related art.
Figure 2:
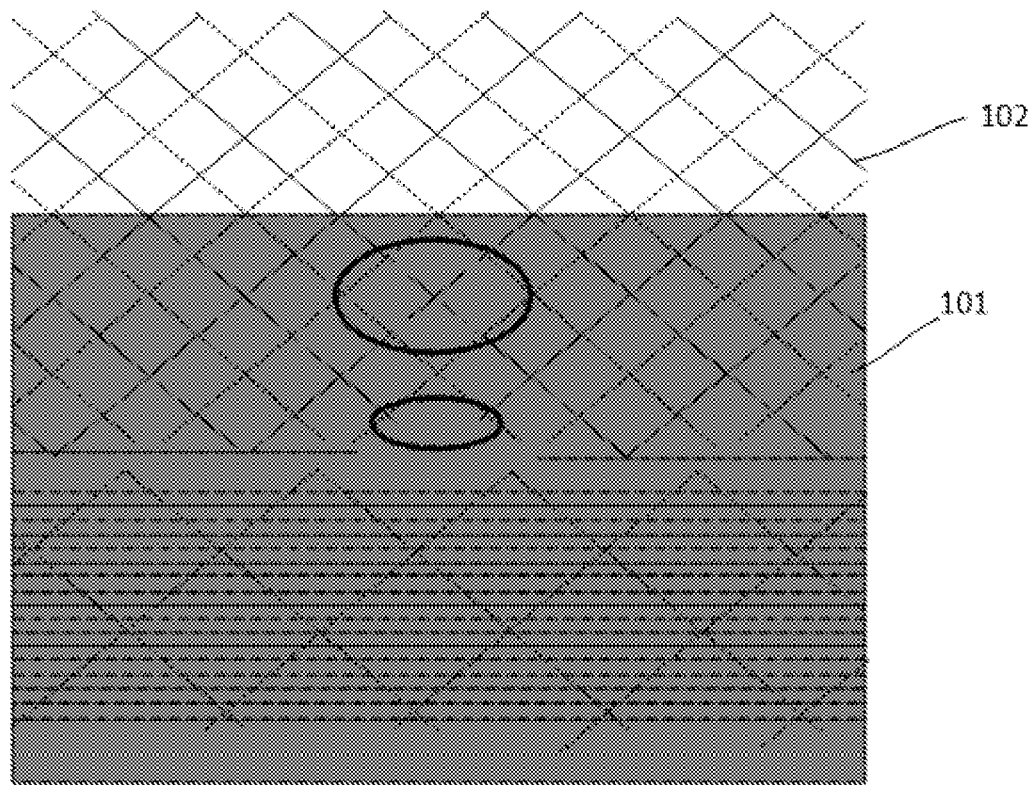
FIG. 2 is a partial view of the structure of the OGM device in the related art.

Referring to FIG. 1, it is a schematic diagram of a structure of an OGM device in the related art. The OGM device includes a base substrate (not shown), a black matrix (BM) 101 provided on the base substrate, and a metal mesh layer 102. The black matrix 101 is provided in a peripheral region of the base substrate and used to shade light, and the metal mesh layer 102 is used to form touch electrodes. In order to form a plurality of touch electrodes, the metal mesh lines of the metal mesh layer 102 in the same layer need to be cut at certain positions (FIG. 1 is only an overall view, and does not show the cuts). As shown in a region enclosed by an elliptical frame in FIG. 2, charges are apt to accumulate at the tips of the metal mesh lines at the cuts, resulting in Electro-Static Discharge (ESD).

The material for forming the black matrix 101 are generally composed of carbon particles and an insulation material wrapping the carbon particles, and the accumulated charges on the surface are difficult to be conducted to outside. When the ESD occurs on the metal mesh lines in the region of black matrix 101, the structure of the material of the black matrix 101 may be damaged, and the wrapped carbon particles become exposed, making the black matrix 101 a conductor, causing a short circuit and resulting in poor appearance.

Figure 3:
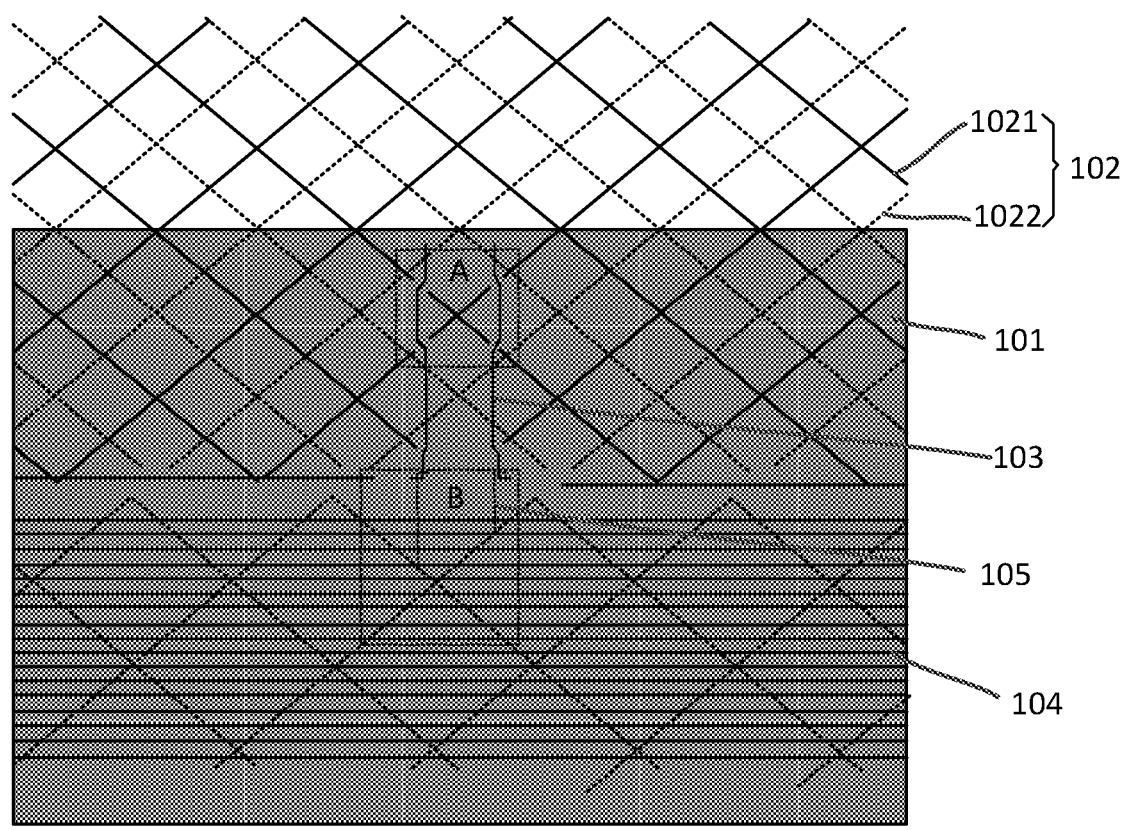
FIG. 3 is a partial view of a structure of a touch screen of an embodiment of the present disclosure.
Figure 4:
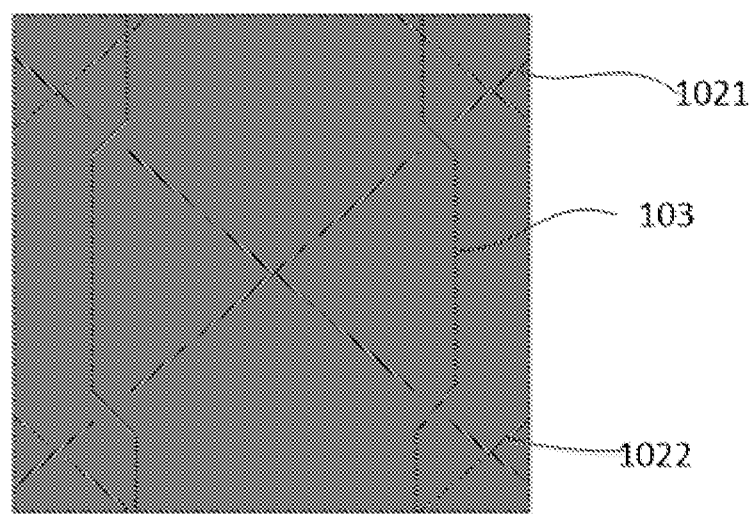
FIG. 4 is an enlarged view of the touch screen in FIG. 3 at a position A.
Figure 5:
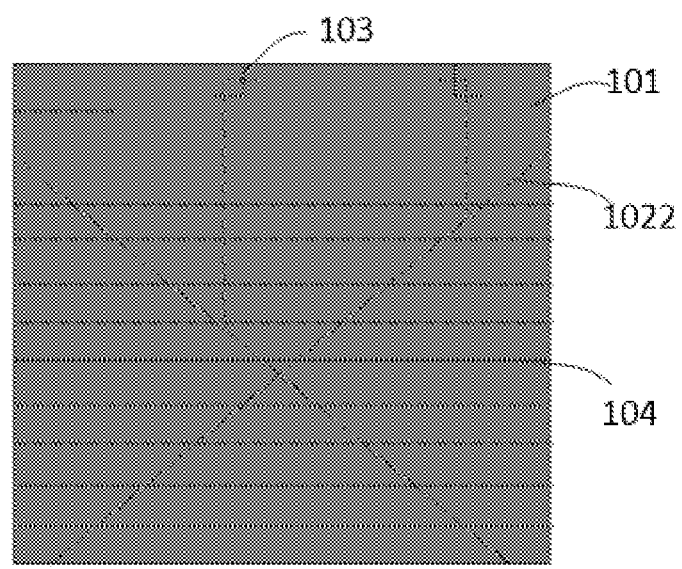
FIG. 5 is an enlarged view of the touch screen in FIG. 3 at a position B.

In order to solve the above problem, referring to FIGS. 3, 4 and 5, a touch screen of an embodiment of the present disclosure includes:

a base substrate (not shown in the figures) which includes a touch region and a peripheral region located in the periphery of the touch region;

black matrix 101 which is provided in the peripheral region and for shading light;

at least one metal mesh layer 102, wherein each metal mesh layer 102 includes a plurality of electrodes insulated from each other;

electrostatic leading lines 103 which are provided for leading the electrostatic charge, wherein the electrostatic leading lines 103 extend among the plurality of electrodes of the at least one metal mesh layer and are connected to at least one grounding wire, and the electrostatic leading lines are arranged to be insulated from the plurality of electrodes.

In the embodiment of the present disclosure, by providing the electrostatic leading lines at the cuts of the metal mesh lines in the peripheral region, the electrostatic charges at the cuts of the metal mesh lines can be conducted to outside in time, avoiding the electrostatic charge accumulation at the cuts of the metal mesh lines, thereby it is possible to reduce the ESD risk essentially and enhance the anti-ESD performance of the touch screen.

In an embodiment of the present disclosure, the electrostatic leading lines 103 are arranged in the same layer and formed with the same material as the metal mesh layer 102, thereby they may be formed in a single patterning process, and the manufacturing cost is saved.

In an embodiment of the present disclosure, the electrostatic leading lines 103 are substantially vertical; obviously, the shape of the electrostatic leading lines 103 is not limited in the present disclosure, and may be adjusted according to the position of the cut of the metal mesh line.

As for the metal mesh layer 102, it should be noted that, in some cases, one electrode may include multiple electrode blocks connected with each other, and the electrode as mentioned here refers to the whole electrode, instead of any electrode block in the electrode. Since the adjacent electrodes should be insulated from each other, the metal mesh lines between the adjacent electrodes should be disconnected from each other. The electrode as mentioned here may be a touch electrode for actual touching, or a dummy electrode not used for touching. The touch electrode is connected to a touch chip, while the dummy electrode is not connected to the touch chip. The dummy electrode may be provided for the purpose of display uniformity, and the like.

In an embodiment of the present disclosure, optionally, the metal mesh layer 102 covers throughout the entire touch region of the touch screen. When the touch screen of such a structure is applied to a display device, it contributes to the display uniformity of the display device.

The touch screen in the embodiment of the present disclosure may include only one metal mesh layer 102. The touch screen including only one metal mesh layer 102 may be a self-capacitive touch screen, or a mutual-capacitive touch screen. In a mutual-capacitive touch screen, a metal mesh layer 102 includes both touch electrodes and sensing electrodes thereon, and the touch electrodes and the sensing electrodes in the same layer are arranged alternately and insulated from each other.

The touch screen in the embodiment of the present disclosure may include at least two metal mesh layers 102: one is the first metal mesh layer 1021 (the metal mesh layer represented by solid lines in FIG. 3), and the other is the second metal mesh layer 1022 (the metal mesh layer represented by dotted lines in FIG. 3). The first metal mesh layer 1021 and the second metal mesh layer 1022 are arranged in different layers and insulated from each other. The first metal mesh layer 1021 includes a plurality of first electrodes, the second metal mesh layer 1022 includes a plurality of second electrodes; one of the first electrode and the second electrode is a driving electrode, and the other is a sensing electrode. Further, in order to insulate the first metal mesh layer 1021 from the second metal mesh layer 1022, the touch screen in the embodiment of the present disclosure further includes an insulation layer (not shown in the figures) which is located between the first metal mesh layer 1021 and the second metal mesh layer 1022.

In an embodiment of the present disclosure, if the touch screen includes two metal mesh layers 102, each of the two metal mesh layers 102 may be provided thereon with the above electrostatic leading lines 103. Obviously, it is also possible to provide the electrostatic leading lines 103 on only one of the metal mesh layers 102.

In an embodiment of the present disclosure, the peripheral region includes a plurality of peripheral sub-regions located on the outside of different edges of the touch region, respectively; wherein at least one of the peripheral sub-regions has first electrode wirings 104 and a second grounding wire 105 provided therein. The second grounding wire 105 is used for grounding, and arranged in the same layer as the second electrodes.

The electrostatic leading lines 103 include first electrostatic leading lines which are provided in the same layer as the first electrodes, wherein, at least one of the first electrostatic leading lines 103 are provided in the same peripheral sub-region as the first electrode wirings 104, and have a different extending direction from that of the first electrode wirings 104 (in the embodiment shown in FIG. 3, the extending direction of the first electrode wirings 104 is substantially horizontal, while the extending direction of the first leading lines is substantially vertical). The first electrostatic leading lines are connected to the second grounding wire 105 through via holes in the insulation layer, thereby achieving grounding.

In an embodiment of the present disclosure, the electrode wirings serve to connect the touch electrodes to a touch chip.

If electrode wirings provided in the same layer as the electrostatic leading lines 103 exist in a peripheral sub-region, the electrostatic leading lines 103 cannot be connected to the grounding wire in the same layer to achieve grounding across the electrode wirings in the same layer, thus, they should be connected to the grounding wire in another layer through the via holes. In an embodiment of the present disclosure, the first electrostatic leading lines in the same layer as the first metal mesh layer 1021 may be connected to the second grounding wire 105 in the same layer as the second metal mesh layer 1022, thereby leading the electrostatic charge to the ground. Obviously, the first electrostatic leading lines may be connected to the grounding wire in a layer other than the second grounding wires 105 of the second metal mesh layer 1022, as long as grounding is achieved.

In an embodiment of the present disclosure, the touch screen may further include:

first grounding wires for grounding, which are provided in the same layer as the first electrodes, and provided in a different peripheral sub-region from the first electrode wirings; wherein at least one of the first electrostatic leading lines are provided in the same peripheral sub-region as and connected to the first grounding wires.

That is to say, if there is no electrode wire provided in the same layer as the electrostatic leading lines 103 in a peripheral sub-region, the electrostatic leading lines may be connected to the grounding wire in the same layer so as to achieve grounding.

In an embodiment of the present disclosure, optionally, the touch region is rectangular having four edges, and thus includes four peripheral sub-regions.

In the above embodiment, the connection manner of the electrostatic leading lines 103 of the first metal mesh layer 1021 is described. Similarly, when the second metal mesh layer 1022 also includes electrostatic leading lines 103, the electrostatic leading lines 103 of the second metal mesh layer 1022 may also be connected in the same manner.

In other words, at least one peripheral sub-region has second electrode wirings and first grounding wire provided therein, wherein the second electrode wirings are provided in the same layer of the second electrodes, the first grounding wire is used for grounding, and arranged in the same layer of the first electrodes.

The electrostatic leading lines includes second electrostatic leading lines provided in the same layer of the second electrodes, wherein at least one of the second electrostatic leading lines is provided in the same peripheral sub-region as the second electrode wirings, and has a different extending direction from that of the second electrode wirings. The at least one second electrostatic leading line is connected to the first grounding wire through a via in the insulation layer.

Optionally, at least one second electrostatic leading line is provided in the same peripheral sub-region as and connected to a second grounding wire. The second grounding wire here is used for grounding, arranged in the same layer as the second electrodes, and provided in different peripheral sub-region from the second electrode wirings; wherein at least one second electrostatic leading line and the second grounding wire are provided in the same peripheral sub-region, and are connected to each other by a second electrode wiring; that is to say, in this case, in a peripheral sub-region, there is no electrode wiring provided in the same layer as the electrostatic leading lines 103. In this case, the electrostatic leading lines may be connected to the grounding wire in the same layer directly so as to achieve grounding.

In an embodiment of the present disclosure, if each of the peripheral sub-regions includes therein the electrostatic leading lines and the electrode wirings provided in the same layer, and in the same peripheral sub-region, the extending direction of the electrostatic leading lines is different from that of the electrode wirings provided in the same layer, the electrostatic leading lines 103 may be connected to a grounding wire provided in a different layer through via holes; if there is any peripheral sub-region which does not include both the electrostatic leading lines and the electrode wirings provided in the same layer, and this peripheral sub-region is further provided with a grounding wire in the same layer thereof, then the electrostatic leading lines may be directly connected to a grounding wire in the same layer thereof.

In a case that the touch screen includes only one metal mesh layer, the above connection manner of the electrostatic leading lines is also applicable.

The touch screen in the above embodiments may be the OGM.

In the above embodiments, the touch screen is a separate device, and can be attached to the surface of a display substrate directly. In some other embodiments of the present disclosure, the touch screen may also be integrated on the display substrate. In other words, the present disclosure further provides a display substrate including the touch screen in any of the above embodiments.

In some optional embodiments of the present disclosure, the base substrate of the touch screen is also used as the base substrate of the display substrate so as to reduce the thickness of the display substrate.

The present disclosure further provides a touch display device including the above touch screen or the above display substrate.

An embodiment of the present disclosure further provides a manufacturing method of a touch screen, including:

S11: providing a base substrate, the base substrate including a touch region and a peripheral region provided at the periphery of the touch region;

S12: forming a black matrix in the peripheral region;

S13: forming patterns of at least one metal mesh layer and electrostatic leading lines, a part of the metal mesh layer being provided in the touch region, and a part of the metal mesh layer being provided in the peripheral region, each metal mesh layer including a plurality of electrodes, metal mesh lines between adjacent electrodes located in a same layer being broken; the electrostatic leading lines being provided for leading the electrostatic charge, arranged in the peripheral region, and located at cuts of the metal mesh lines, and extending through the cuts of a plurality of the metal mesh lines, being provided in the same layer as the metal mesh layer and insulated from the metal mesh layer.

In the embodiments of the present disclosure, by forming the electrostatic leading lines at the cuts of the metal mesh lines in the peripheral region, the electrostatic charges at the cuts of the metal mesh lines can be conducted to outside in time, avoiding the electrostatic charge accumulation at the cuts of the metal mesh lines, thereby it is possible to reduce the ESD risk and enhance the anti-ESD performance of the touch screen.

In the embodiments of the present disclosure, the metal mesh layer and the electrostatic leading lines may be formed in a single patterning process, reducing the manufacturing cost.

In some specific embodiments of the present disclosure, the manufacturing method of the touch screen includes:

Step S21: providing a base substrate, the base substrate including a touch region and a peripheral region located in the periphery of the touch region;

Step S22: forming a black matrix in the peripheral region;

Step S23: forming an insulation layer (OC layer);

Step S24: forming patterns of a first metal mesh layer and first electrostatic leading lines, a part of the first metal mesh layer being provided in the touch region, and a part of the first metal mesh layer being provided in the peripheral region, the pattern of the first metal mesh layer including a plurality of electrodes, metal mesh lines between adjacent electrodes being broken, the plurality of electrodes of the first metal mesh layer including first electrodes; the first electrostatic leading lines being provided for leading the electrostatic charge, located at cuts of the metal mesh lines of the first metal mesh layer in the peripheral region, and extending through the cuts of a plurality of the metal mesh lines of the first metal mesh layer, being provided in the same layer as the first metal mesh layer and insulated from the first metal mesh layer.

Specifically, the patterns of the first metal mesh layer and the first electrostatic leading lines may be formed by a photolithography process which includes coating, exposure, developing, etching, cleaning, etc.

Step S25: forming an insulation layer on the first metal mesh layer and the first electrostatic leading lines;

Step S26: forming patterns of a second metal mesh layer and second electrostatic leading lines, a part of the second metal mesh layer being provided in the touch region, and a part of the second metal mesh layer being provided in the peripheral region, the pattern of the second metal mesh layer including a plurality of electrodes, metal mesh lines between adjacent electrodes being broken, the plurality of electrodes of the second metal mesh layer including second electrodes; the second electrostatic leading lines being provided for leading the electrostatic charge, located at the peripheral region and at cuts of the second metal mesh lines, and extending through the cuts of a plurality of the metal mesh lines of the second metal mesh layer, being provided in the same layer as the second metal mesh layer and insulated from the second metal mesh layer.

Specifically, the patterns of the second metal mesh layer and the second electrostatic leading lines may be formed by a photolithography process which includes coating, exposure, developing, etching, cleaning, etc.

Step S27: forming an insulation layer on the second metal mesh layer and the second electrostatic leading lines.

It should be noted that, the expression "provided in the same layer" means the objects are located on the same surface, the surface may be flat, or there may be a step difference. Since they are on the same surface, they can be obtained by a same patterning process using a same material, which simplifies the manufacturing process; obviously, they may be manufactured by multiple patterning processes. The patterning process may further include the processes such as printing, screen printing, and so on, in addition to the photolithography process.

Unless otherwise defined, technical terms or scientific terms used in the present disclosure should be understood in the ordinary meaning of those of ordinary skill in the art. The words "first," "second," and similar terms used in the present disclosure do not denote any order, quantity, or importance, but are used to distinguish different components. The words "connecting" or "connected to" and the like are not limited to physical or mechanical connections, but may include electrical connections, whether direct or indirect. "Upper", "lower", "left", "right", etc. are only used to indicate the relative positional relationship, and when the absolute position of the object to be described is changed, the relative positional relationship is also changed accordingly.

The above embodiments are the exemplary implementations of the present disclosure. It should be noted that, those skilled in the art may make various modifications and improvements without departing from the principle of the present disclosure, and these modifications and improvements should also be considered as the protective scope of the present disclosure.

What is claimed is:

1. A touch screen, comprising:
   at least one metal mesh layer, wherein each metal mesh layer comprises a plurality of electrodes insulated from each other; and
   electrostatic leading lines which extend among the plurality of electrodes of the at least one metal mesh layer and are connected to a grounding wire, wherein the electrostatic leading lines are arranged to be insulated from the plurality of electrodes,
   wherein the at least one metal mesh layer comprises a first metal mesh layer and a second metal mesh layer, the first metal mesh layer comprises a plurality of first electrodes and wherein the first metal mesh layer further comprises first electrode wirings at periphery of the plurality of first electrodes, an extending direction of the electrostatic leading lines is different from that of the first electrode wirings.

2. The touch screen according to claim 1, wherein at least one metal mesh layer comprises the grounding wire, and in the at least one metal mesh layer comprising the grounding wire, the electrostatic leading lines and the grounding wire are arranged in a same layer and electrically connected.

3. The touch screen according to claim 1, wherein the second metal mesh layer comprises a plurality of second electrodes, the electrostatic leading lines extend among the plurality of first electrodes, and are connected to a grounding wire provided in the second metal mesh layer through via holes.

4. The touch screen according to claim 3, wherein the second metal mesh layer further comprises second electrode wirings at the periphery of the plurality of second electrodes, the second electrode wirings are connected to the grounding wires provided in the second metal mesh layer, and the electrostatic leading lines are connected to the second electrode wirings through the via holes.

5. The touch screen according to claim 3, wherein the first metal mesh layer further comprises first electrode wirings at the periphery of the plurality of first electrodes, an extending direction of the electrostatic leading lines is different from that of the first electrode wirings.

6. The touch screen according to claim 1, wherein the touch screen is divided into a touch region and a peripheral region located at the periphery of the touch region, a black matrix is provided in the peripheral region, and the electrostatic leading lines extend into the region covered by the black matrix.

7. The touch screen according to claim 3, wherein the first electrodes and the second electrodes are arranged in a crossed manner, one of the first electrode or the second electrode is a driving electrode, and the other is a sensing electrode.

8. The touch screen according to claim 3, wherein an insulation layer is disposed between the first metal mesh layer and the second metal mesh layer.

9. A manufacturing method of a touch screen, comprising:
providing a base substrate, the base substrate comprising a touch region and a peripheral region provided at the periphery of the touch region;
forming a black matrix in the peripheral region;
forming patterns of at least one metal mesh layer and electrostatic leading lines, each metal mesh layer comprising a plurality of electrodes insulated from each other, the electrostatic leading lines extending among the plurality of electrodes of the at least one metal mesh layer and being connected to a grounding wire, wherein the electrostatic leading lines are arranged to be insulated from the plurality of electrodes, wherein the at least one metal mesh layer comprises a first metal mesh layer and a second metal mesh layer, the first metal mesh layer comprises a plurality of first electrodes and the first metal mesh layer further comprises first electrode wirings at the periphery of the plurality of first electrodes, an extending direction of the electrostatic leading lines is different from that of the first electrode wirings.

10. A display substrate comprising the touch screen according to claim 1.

11. The display substrate according to claim 10, wherein a base substrate of the touch screen is also used as a base substrate of the display substrate.

12. A touch display device comprising the touch screen of claim 1.

13. A touch display device comprising the display substrate according to claim 10.

\* \* \* \* \*